United States Patent
Lustig et al.

(10) Patent No.: US 8,379,951 B2
(45) Date of Patent: Feb. 19, 2013

(54) AUTO CALIBRATION PARALLEL IMAGING RECONSTRUCTION METHOD FROM ARBITRARY K-SPACE SAMPLING

(75) Inventors: Michael Lustig, Stanford, CA (US); John M. Pauly, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 1209 days.

(21) Appl. No.: 12/024,919

(22) Filed: Feb. 1, 2008

(65) Prior Publication Data

US 2009/0196478 A1 Aug. 6, 2009

(51) Int. Cl.
G06K 9/00 (2006.01)
G06K 9/40 (2006.01)
G06K 9/36 (2006.01)

(52) U.S. Cl. .................... 382/131; 382/260; 382/276
(58) Field of Classification Search .................. 382/128, 382/130, 131, 132, 260–265, 280; 324/300, 324/307, 309; 600/410
See application file for complete search history.

(56) References Cited

U.S. PATENT DOCUMENTS

| | | | |
|---|---|---|---|
| 5,497,089 A * | 3/1996 | Lampman et al. | 324/318 |
| 6,841,998 B1 | 1/2005 | Griswold | |
| 7,132,828 B2 | 11/2006 | Lustig et al. | |
| 7,206,440 B2 * | 4/2007 | August | 382/131 |
| 7,277,597 B2 * | 10/2007 | Lee et al. | 382/280 |
| 7,480,402 B2 * | 1/2009 | Bar-Zohar et al. | 382/131 |
| 7,692,423 B2 * | 4/2010 | Cunningham et al. | 324/307 |
| 7,729,527 B2 * | 6/2010 | Maschauer et al. | 382/132 |
| 7,936,947 B1 * | 5/2011 | Rueckert et al. | 382/294 |
| 8,073,287 B1 * | 12/2011 | Wechsler et al. | 382/278 |
| 2004/0047511 A1 * | 3/2004 | Tzannes et al. | 382/232 |
| 2004/0202356 A1 * | 10/2004 | Stookey et al. | 382/128 |
| 2009/0264782 A1 * | 10/2009 | Pearlman | 600/509 |

OTHER PUBLICATIONS

Pruessmann et al., "Advances in Sensitivity Encoding With Arbitrary k-Space Trajectories," Magn Reson Med, vol. 46, pp. 638-651, 2001.
Griswold et al., "Generalized Autocalibrating Partially Parallel Acquisitions (GRAPPA)," Magn Reson Med, vol. 47, pp. 1202-1210, 2002.
Rudin et al., "Non-linear total variation noise removal algorithm", Physica D, vol. 60, pp. 259-268, 1992.
Lustig et al., "K-Space Consistency GRAPPA", Presented at ISMRM Workshop, Sedona AZ, Feb. 2007.

* cited by examiner

*Primary Examiner* — Phillip A Johnston
*Assistant Examiner* — Brooke Purinton
(74) *Attorney, Agent, or Firm* — Beyer Law Group LLP

(57) ABSTRACT

A method for obtaining an image by parallel acquisition magnetic resonance imaging (MRI) is provided. Precessing nuclear spins are excited in a region of a subject. A plurality of response signals, representing magnetic resonance signals arising from the precessing nuclear spins, are simultaneously obtained from the region respectively with a plurality of RF reception coils, with each response signal representing a reduced data set of a totality of all of said response signals. Calibration data points are additionally obtained for each data set. A filter is synthesized using the calibration data points. The synthesizing filter is applied to the reduced data set to obtain a plurality of coupled simultaneous linear equations with a plurality of unknowns. The plurality of coupled simultaneously linear equations with the plurality of unknowns is solved to obtain a complete data set.

13 Claims, 11 Drawing Sheets

AUTO CALIBRATION PARALLEL IMAGING RECONSTRUCTION METHOD FROM ARBITRARY K-SPACE SAMPLING

STATEMENT REGARDING FEDERALLY SPONSORED RESEARCH OR DEVELOPMENT

This invention was made with Government support under contract NIH-R01HL074332 awarded by the National Institutes of Health, and also under contract NIH-R01HL067161 awarded by the National Institutes of Health. The Government has certain rights in this invention.

BACKGROUND OF THE INVENTION

This invention relates generally to magnetic resonance imaging (MRI), and more particularly the invention relates to MRI with parallel imaging.

Magnetic resonance imaging (MRI) is a non-destructive method for the analysis of materials and is an approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Magnetic resonance (MR) imaging is based on nuclear spins, which can be viewed as vectors in a three-dimensional space. During an MRI experiment, each nuclear spin responds to four different effects: precession about the main magnetic field, nutation about an axis perpendicular to the main field, and both transverse and longitudinal relaxation. In steady-state MRI experiments, a combination of these effects occurs periodically.

Parallel imaging uses multiple receiver coils that each receives signals from a subset of the total volume and combines data of the multiple receiver coils to provide an image for a total volume.

Parallel imaging methods exploit the sensitivity of the receiver coils to accelerate MRI acquisitions. SENSE based reconstructions, as described in Pruessmann et al., "Advances in sensitivity encoding with arbitrary k-space trajectories," MRM 46(4):638-51 (2001), provide a complete general reconstruction from arbitrary k-space sampling. SENSE attempts to reconstruct the imaged object exactly, with no coil weighting. To do so, it requires an accurate explicit measurement of the coils sensitivity. The GRAPPA based reconstructions, as described in Griswold et al, "Generalized autocalibrating partially parallel acquisitions (GRAPPA)," MRM 47(6):1202-10 (2002), are becoming increasingly more popular. GRAPPA type reconstructions do not attempt to reconstruct the exact original object. Instead, they attempt to reconstruct each coil image separately—a significantly relaxed requirement. Therefore it requires only implicit coils sensitivity information in the form of correlations between pixels in k-space. The correlation measurements are obtained by calibration. However GRAPPA reconstruction is not as general as SENSE. Although several non-Cartesian solutions for GRAPPA reconstructions have been proposed, the proposed methods are either approximate, or tailored for specific sampling trajectories.

FIG. 9a is a schematic illustration of a conventional GRAPPA process. In this example a linear k-space scan is used to acquire reduced data 908 for every other row in a Cartesian grid 904. Other Cartesian grids 906 are shown to illustrate reduced data acquired for other coils used in the parallel process. In a calibration region 912 calibration data 916 is fully acquired. A GRAPPA synthesizing filter is generated from the calibration data 916. FIG. 9b schematically shows the generation of a conventional GRAPPA synthesizing filter. In this example, data points 920 above and below a center data point 924 are used to generate the conventional GRAPPA synthesizing filter. Data points 928 on the side of the center data point 924 are not used to generate the conventional GRAPPA synthesizing filter. This is because the scanning pattern is known and the scanning pattern does not scan data points on the sides of the data point being determined by the filter and the conventional GRAPPA uses this known scanning pattern to provide a synthesizing filter.

FIG. 9c is a schematic illustration of the use of the conventional GRAPPA synthesizing filter. A synthesizing filter 932 uses data points above and below a center point 936 to synthesize data for the center point 936. The synthesizing filter may be applied along each row of the Cartesian grid 904 where k-space data was not acquired to synthesize data 940 for each point in the row.

SUMMARY

In accordance with the invention, a method for obtaining an image by parallel acquisition magnetic resonance imaging (MRI) is provided. Precessing nuclear spins are excited in a region of a subject. A plurality of response signals, representing magnetic resonance signals arising from the precessing nuclear spins, are simultaneously obtained from the region respectively with a plurality of RF reception coils, with each response signal representing a reduced data set of a totality of all of said response signals. Calibration data points are additionally obtained for each data set. A filter is synthesized using the calibration data points. The synthesizing filter is applied to the reduced data set to obtain a plurality of coupled simultaneous linear equations with a plurality of unknowns. The plurality of coupled simultaneously linear equations with the plurality of unknowns is solved to obtain a complete data set.

In another manifestation of the invention, a magnetic resonance imaging apparatus is provided. A magnetic resonance imaging excitation and detection system is provided. A controller is electrically connected to the magnetic resonance imaging excitation and detection system. The controller comprises a display, at least one processor and computer readable media. The computer readable media comprises computer readable code for exciting precessing nuclear spins in a region of a subject, computer readable code for simultaneously obtaining a plurality of response signals, representing magnetic resonance signals arising from the precessing nuclear spins, from the region respectively with a plurality of RF reception coils, with each response signal representing a reduced data set of a totality of all of said response signals, computer readable code for additionally obtaining calibration data points for each data set, computer readable code for synthesizing a filter using the calibration data points, computer readable code for applying the synthesizing filter to the reduced data set to obtain a plurality of coupled simultaneous linear equations with a plurality of unknowns, computer readable code for solving the plurality of coupled simultaneously linear equations with the plurality of unknowns to obtain a complete data set, computer readable code for forming an image from the complete data set, and computer readable code for displaying the image on the display.

The invention and objects and features thereof will be more readily apparent from the following detailed description and appended claims when taken with the drawings.

DETAILED DESCRIPTION OF ILLUSTRATIVE EMBODIMENTS

Inspired by the generality of non-Cartesian SENSE, an embodiment of the invention provides a general, accurate solution for a GRAPPA type reconstruction that recovers the coils images separately without explicit sensitivity information. The reconstruction is formulated as an inverse problem optimization, forcing consistency with the calibration and acquisition data. The optimization has a simple, efficient and rapidly converging iterative solution. In addition, the iterations require only inexpensive Cartesian convolution operations and the calibration is inexpensive as well.

An embodiment of the invention has the following advantages: It can be used to rapidly solve parallel imaging reconstructions from arbitrary k-space sampling, i.e., Cartesian equispaced and variable density grid undersampling as well as non-Cartesian trajectories like radial and spirals. Variable density sampling is attractive, because any residual artifacts in the reconstruction are incoherent as opposed to coherent artifacts in traditional equispaced undersampling. In addition, the optimization formulation enables image based regularized reconstruction, which is available in SENSE reconstructions to reduce noise, but is not in traditional GRAPPA type reconstructions.

Technical Description

The original GRAPPA algorithm, exploits the correlation of k-space samples. It synthesizes missing k-space data points using a linear combination of multi-coil neighboring points. The linear combination coefficients, i.e., the GRAPPA filter or synthesizing filter, are obtained by calibration on a fully sampled subset of k-space, often close to the origin.

Figure 1:
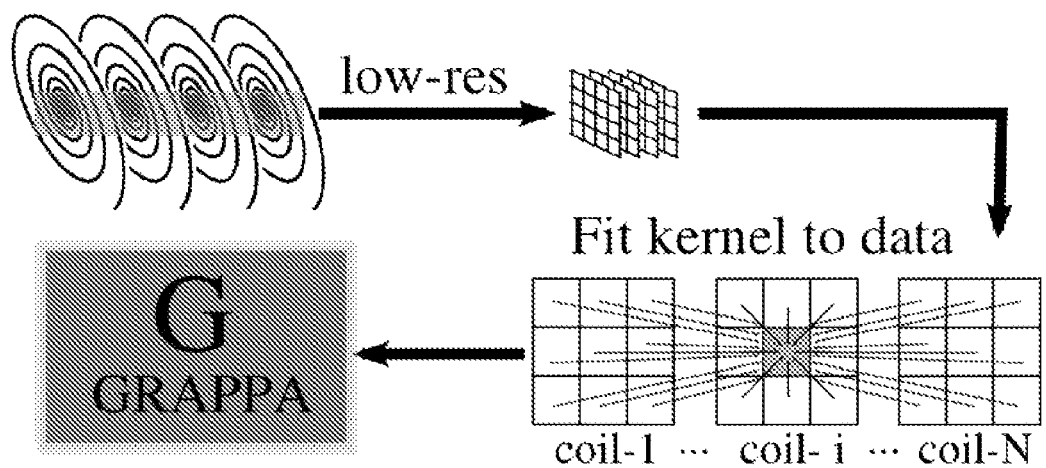
FIG. 1 illustrates a process using a Cartesian synthesizing filter.

Here, the case of arbitrary sampling of k-space is examined. First, it is assumed that there is always a calibration region from which a Cartesian calibration area can be generated (for example, by regridding) and that a Cartesian synthesizing filter can be obtained, as illustrated in FIG. 1. Ideally, if the coil images were able to be reconstructed correctly (by any possible method) to get a full Cartesian k-space image, applying the synthesizing filter on the reconstructed k-space (synthesized+acquired) should yield the exact same data—because it should be consistent with the calibration data. This observation leads to a new inverse problem formulation for reconstructing the coils images. Cartesian k-space images are searched for, which are consistent (up to <noise) with the acquired data from the scanner (not necessarily Cartesian), and which results in the minimal residual—i.e., also consistent with the calibration data when applying the synthesizing filter. These desired k-space images are the solution for the following optimization:

$$\text{minimize } |Gx-x|^2 \tag{1}$$

$$s.t. \ |Dx-y|^2 < \epsilon$$

Figure 2:
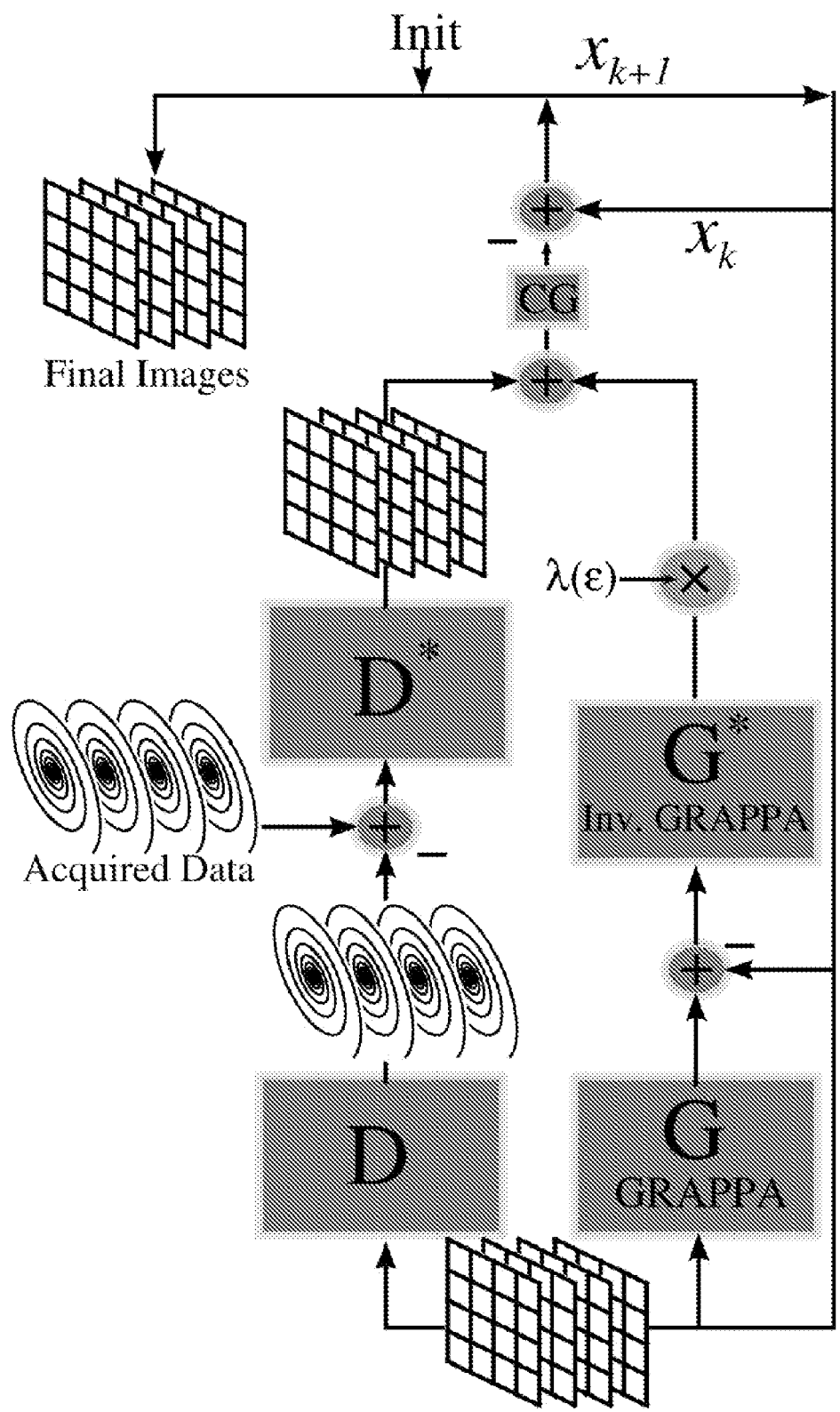
FIG. 2 illustrates a reconstruction algorithm used in an embodiment of the invention.

Here, $x=[x_1, x_2, \ldots, x_n]^T$ is the desired full-grid multi-coil reconstructed k-space images, $y=[y_1, y_2, \ldots, y_n]^T$ is the acquired multi-coil data from the scanner, G is the Cartesian synthesizing convolution filter (GRAPPA filter), and D is a resampling operator. In Cartesian grid sampling, D selects the acquired k-space lines from the full grid, in non-Cartesian sampling, D is a regridding convolution operator. Equation 1 is a Quadratic Constrained Quadratic Program (QCQP) and as such has standard solvers, as described in Boyd S, Vandenberghe L, "Convex Optimization". Cambridge University Press, 2004, which is incorporated by reference, a simple solution is to solve the Lagrangian form of Equation 1, $|Dx-y|^2+\lambda(\epsilon)|Gx-x|^2$ iteratively using Conjugate Gradients (CG) methods. Such reconstruction algorithm is illustrated in FIG. 2. The operators G* and D* in FIG. 2 are conjugates of G and D and are Cartesian convolutions as well.

Figure 3:
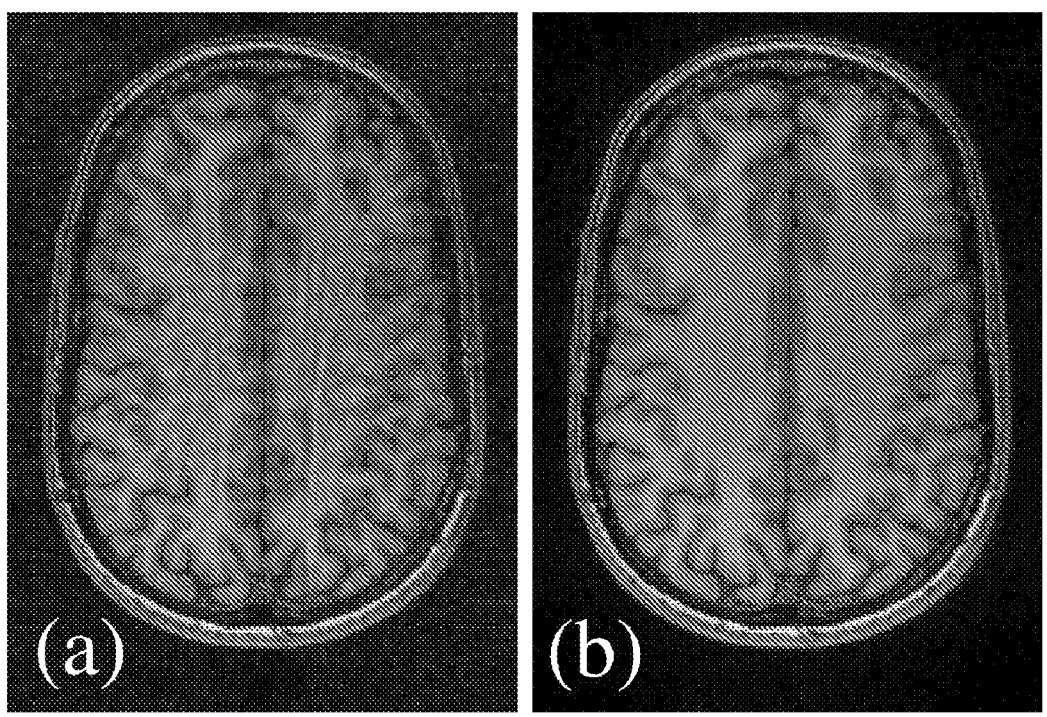
FIGS. 3a and b shows the results of an experiment, which uses an embodiment of the invention.

To demonstrate the generality of the approach the reconstruction on a randomly undersampled data set by undersampling the phase-encodes (2-fold) of a $T_1$ weighted, Cartesian 3D SPGR sequence of a brain (matrix=256×180×160, res=1 mm, TR/TE=32/5 ms, flip=20) was tested. The data was acquired on a 1.5 T GE Signa Excite scanner using an 8 channel head coil array. Five CG iterations were performed. FIGS. 3a and b shows the results of the experiment. FIG. 3a is a sum-of-squares reconstruction from the undersampled data. It exhibits significant incoherent artifacts due to the undersampling. In FIG. 3b the undersampling artifacts are removed by the reconstruction in an embodiment of the invention. The advantage of random undersampling is that any residual aliasing will be incoherent and will appear as noise, as opposed to coherent artifact in traditional equispaced GRAPPA.

Figure 4:
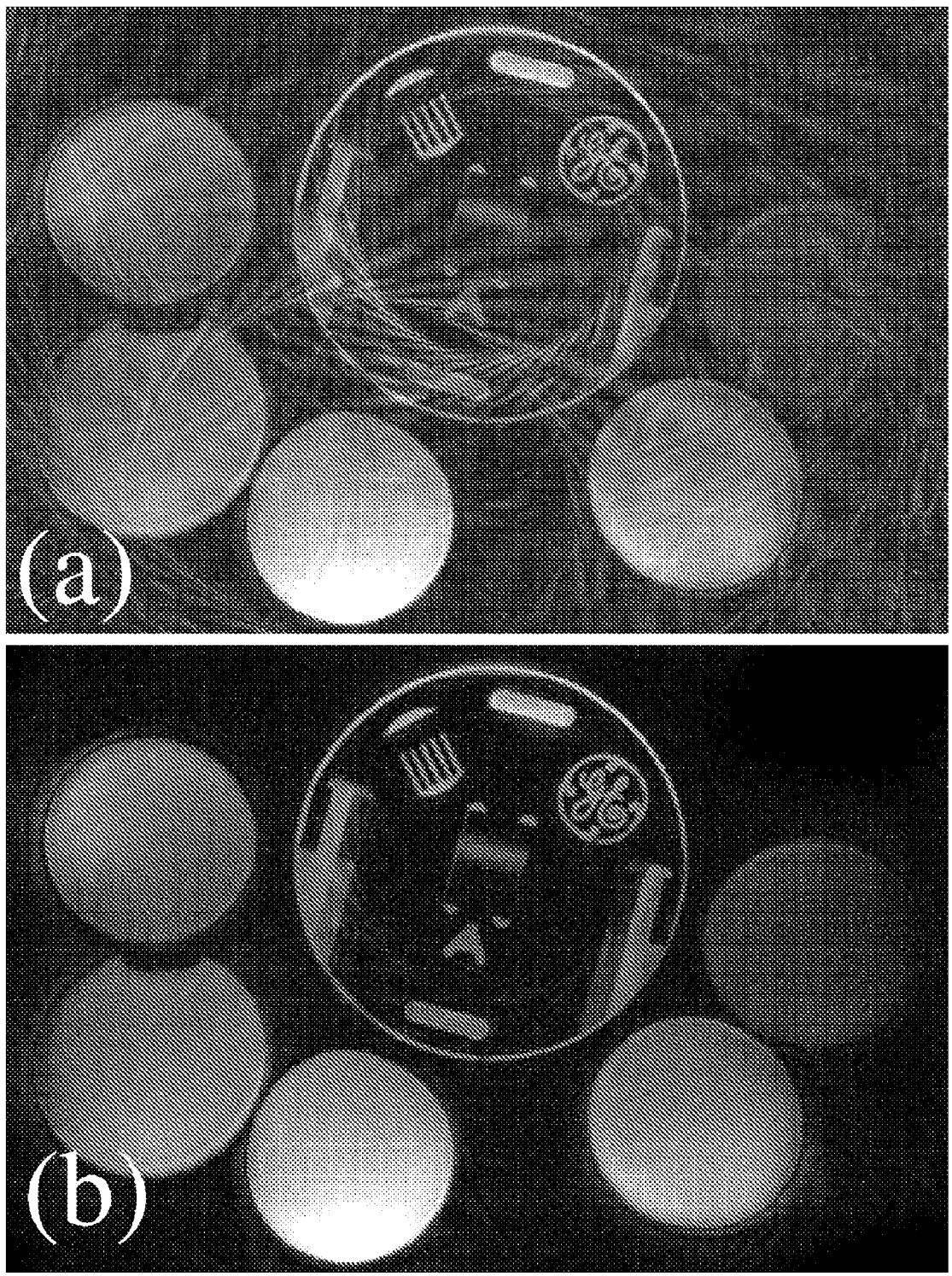
FIGS. 4a and b show the results of another experiment using an embodiment of the invention.

To demonstrate a non-Cartesian reconstruction, an undersampled (3-fold) spiral acquisition (20 out of 60 interleaves, readout=5 ms, TR/TE=30/2.5 ms, res 0.75 mm, FOV=30 cm) of a phantom was constructed, 4 out of 8 channels of the Cardiac coil array were used. Ten CG iterations were performed. The result was compared to a sum-of-squares reconstruction from undersampled data. FIGS. 4a and b show the results of the experiment. FIG. 4a is a sum-of-squares reconstruction from the undersampled data. It exhibits significant incoherent artifacts due to the 3-fold undersampling. In FIG. 4b most of the undersampling artifacts are removed by the reconstruction under an embodiment of the invention. Some residual artifacts remain, mainly in the center of the image where the coils sensitivities are low. The residual artifacts appear also because it is a 3-fold acceleration using only 4-coils.

Extension for Regularized Reconstruction

Parallel imaging reconstruction is inherently noise enhancing, since the coils sensitivities are not orthogonal. In the SENSE approach, it is possible to regularize the reconstruction based on image priors. In practice, mostly Tychonov regularization is used. In traditional GRAPPA type reconstructions, it is only possible to regularize the calibration of the synthesizing filter. This regularization may reduce artifacts, but cannot reduce the noise amplification.

An embodiment of the invention enables image based regularization. This is done by a slight modification of Equation 1 to include a regularizing term in the objective, $$\text{minimize } |Gx-x|^2 + \lambda R(F^{-1}x) \quad (1)$$

$$s.t. \ |Dx-y|^2 < \epsilon \quad (2)$$

Here, $F^{-1}x$ denotes the inverse Fourier transform of the reconstructed k-space data. Hence, $F^{-1}x$ are the reconstructed images. R is a regularization function. For example, setting R to be the $l_2$-norm, results in a Tychonov regularization. Another attractive choice of R is the Total Variation of the image, which is known to suppress noise while preserving the features in the image, as discussed in Rudin L, Osher S, Fatemi E. Non-linear total variation noise removal algorithm. Phys. D 1992; 60:259-268.

Figure 5:
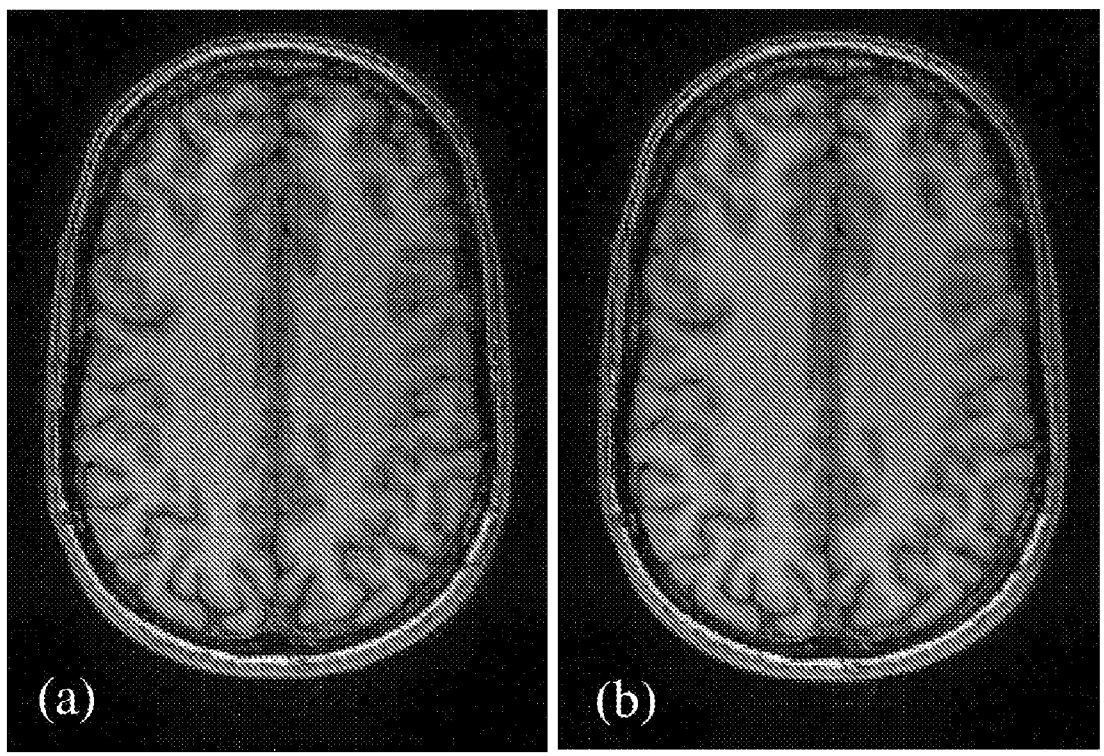
FIGS. 5a and b show reconstruction results from a 4-fold accelerated acquisition.

FIGS. 5a and b show reconstruction results from a 4-fold accelerated acquisition. FIG. 5a was reconstructed without regularization. In FIG. 5b, where a TV regularization was used, a reduction in noise can be seen.

Figure 6:
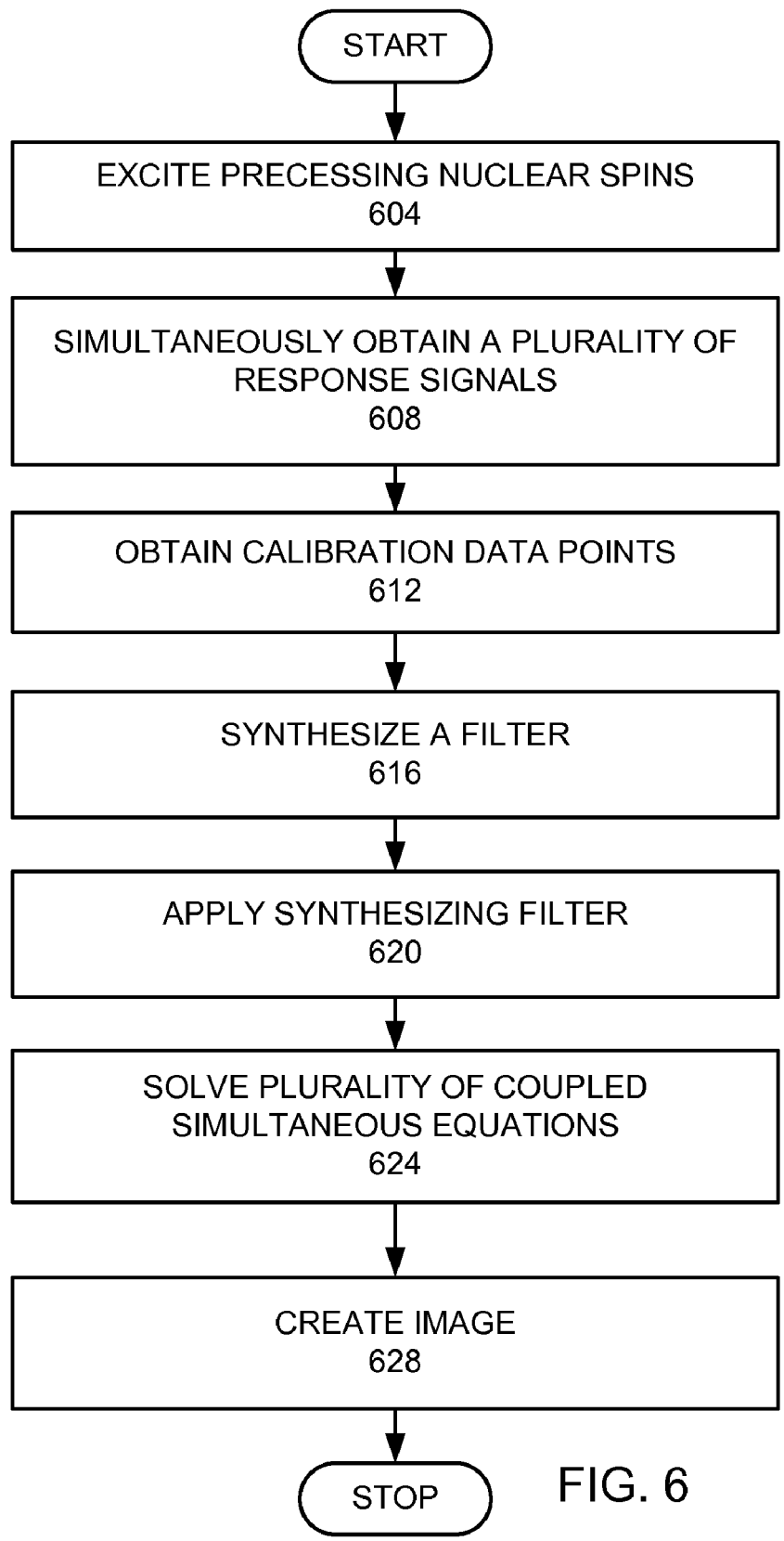
FIG. 6 is a high level flow chart of an embodiment of the invention.
Figure 10A:
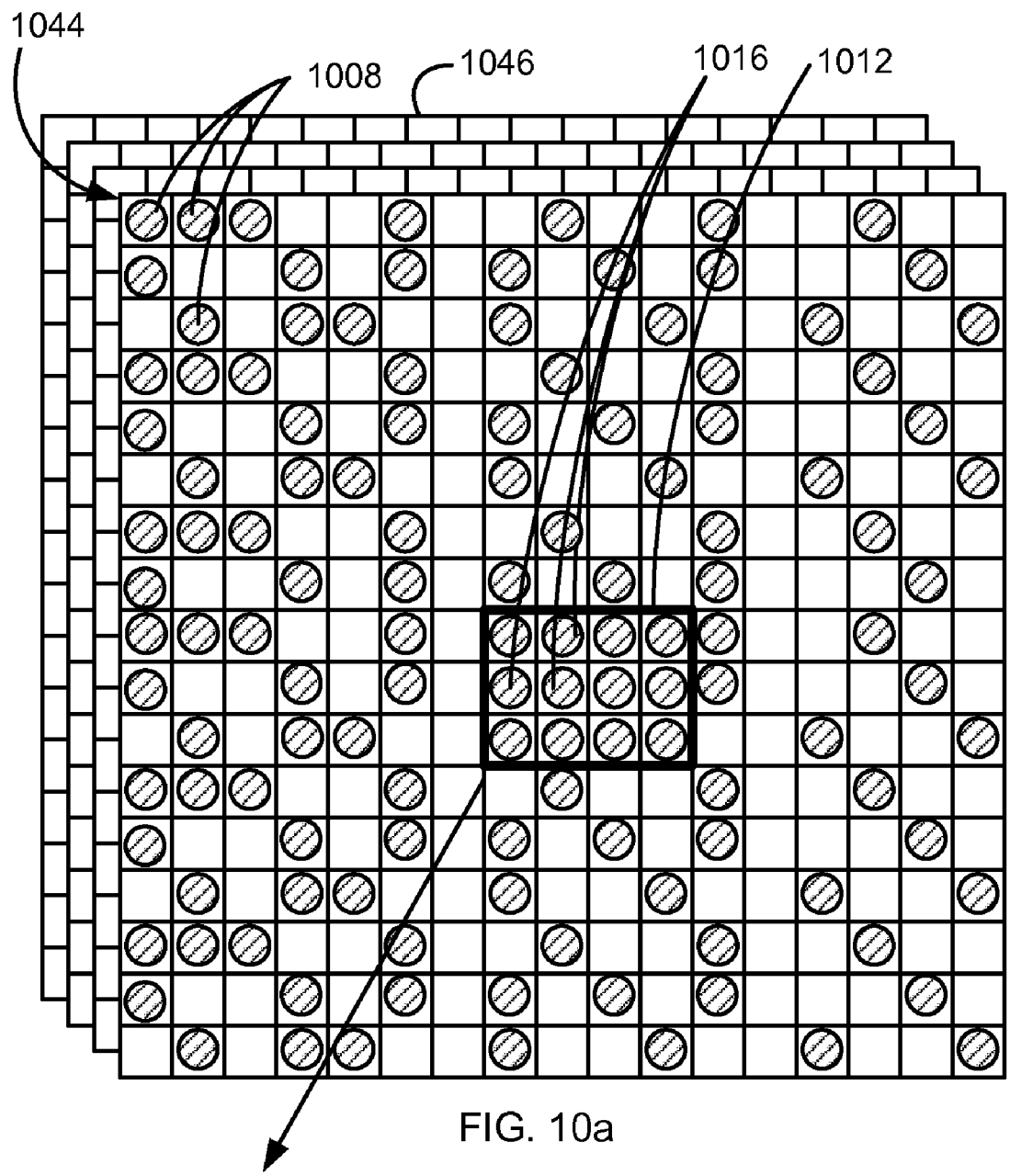
FIGS. 10a-c are schematic illustrations of an embodiment of the invention.
Figure 10B:
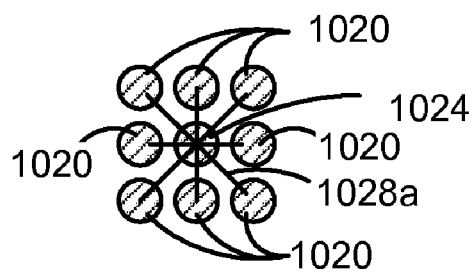

FIG. 6 is a high level flow chart of an embodiment of the invention. Precessing nuclear spins are excited in a region of a subject (step 604). A plurality of response signals are simultaneously obtained, where the signals represent magnetic resonance signals arising from the precessing nuclear spins from the region, where a plurality of RF reception coils are used and where each response signal represents a reduced k-space data set of a totality of all the response signals (step 608). FIG. 10a is a schematic illustration of a reduced k-space data set 1044 from a coil that may be obtained under an embodiment of the invention. In this embodiment, the reduced k-space data set is 1044 on a Cartesian grid. Other reduced k-space data sets 1046 are obtained from other coils. Individual acquired data point values 1008 are placed on the Cartesian grid. If the acquisition is not in a Cartesian grid, a gridding process may be used to place the data point values 1008 on the Cartesian grid. Calibration data point values are also obtained for each data set (step 612). In this example calibration data 1016 is fully acquired for a calibration region 1012. A filter is synthesized using the calibration data point values (step 616). In this example, the filter is synthesized by selecting a data point 1024 and using all data points 1020 adjacent to the selected data point of the calibration data points to calculate the synthesizing filter 1028a, as shown in FIG. 10b. In other embodiment, more or less than all of the adjacent data points may be used. The synthesizing filter may provide calibration weights.

Figure 10C:
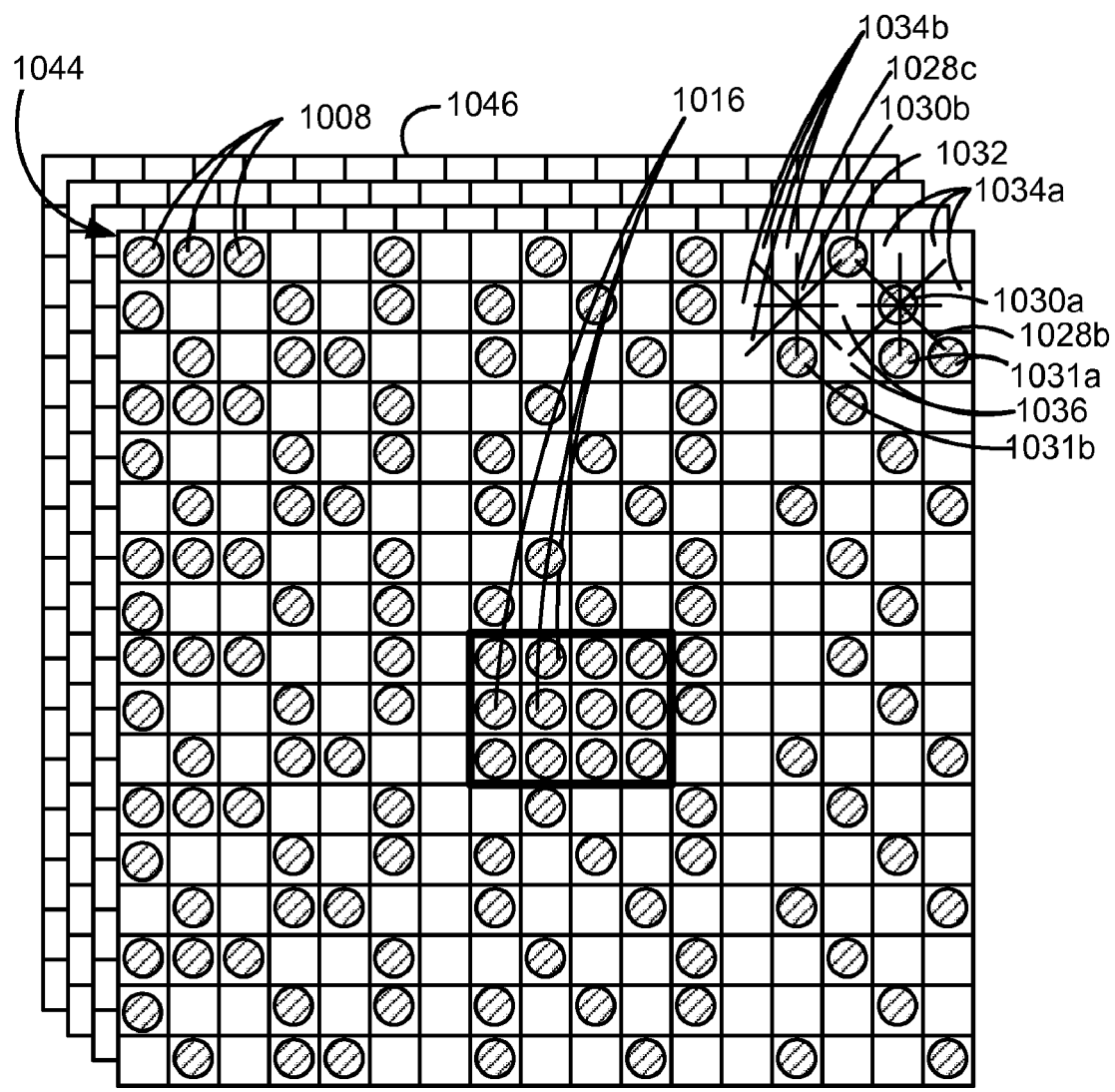

The synthesizing filter is applied to the reduced data set to obtain a plurality of coupled simultaneous linear equations (step 620). In a preferred embodiment, the applying the synthesizing filter to the reduced k-space data set comprises selecting points and applying the synthesizing filter. For at least one application of the synthesizing filter, at least two points from the combination of the selected point and the adjacent points used by the synthesizing filter have an unknown value, which causes the coupling of the simultaneous equations. Coupled simultaneous equations are equations where at least some of the equations have too many unknowns to be solved by themselves and where the equations share common unknowns to couple them and allow them to be solved simultaneously. By coupling a plurality of equations together, there are enough equations to solve for all unknowns, and such equations are then solved simultaneously. FIG. 10c illustrates the application of the synthesizing filter. In this example, a first application of the synthesizing filter 1028b has a selected point 1030a with a known value, three adjacent points 1031a, 1032 used by the first application of the synthesizing filter 1028b with known values and five adjacent points 1034a and 1036 used by the first application of the synthesizing filter 1028b with unknown values. A second application of the synthesizing filter 1028c has a selected point 1030b with an unknown value, two adjacent points 1031b, 1032 used by the second application of the synthesizing filter 1028c with known values, and six adjacent points 1034b and 1036 used by the second application of the synthesizing filter 1028c with unknown values. The first application of the synthesizing filter 1028b provides an equation with five unknown values 1034a and 1036. The second application of the synthesizing filter 1028c provides an equation with six unknowns 1030b, 1034b, 1036. Since two of the unknowns 1036 are common between the equations from the first and second applications of the synthesizing filter, the equations are coupled. The unknowns for these equations are combinations of the selected points and adjacent points, where both equations have at least two unknowns from the combinations of the selected points and the adjacent points. More generally, other embodiments of the invention must have at least one equation with two unknowns from the combination of the selected point and the adjacent points, which means that the unknown may be a selected point and an adjacent point or two adjacent points. Since the equation generated from the first application of the synthesizing filter 1028b has unknown values for k-space points 1036 and the equation generated from the second application of the synthesizing filter 1028c has the same unknown values for the k-space points 1036, these equations would be coupled. This application of the synthesizing filter allows the synthesizing filter to be sampling pattern independent.

The plurality of coupled simultaneous equations is solved (step 624). In one embodiment, the solving the simultaneous equations solves a constraint optimization. An image is created from the solutions of the simultaneous equations and the reduced k-space data set (step 628). In an embodiment, the creation of the image may require a Fourier transform for k-space to image space.

Figure 7:
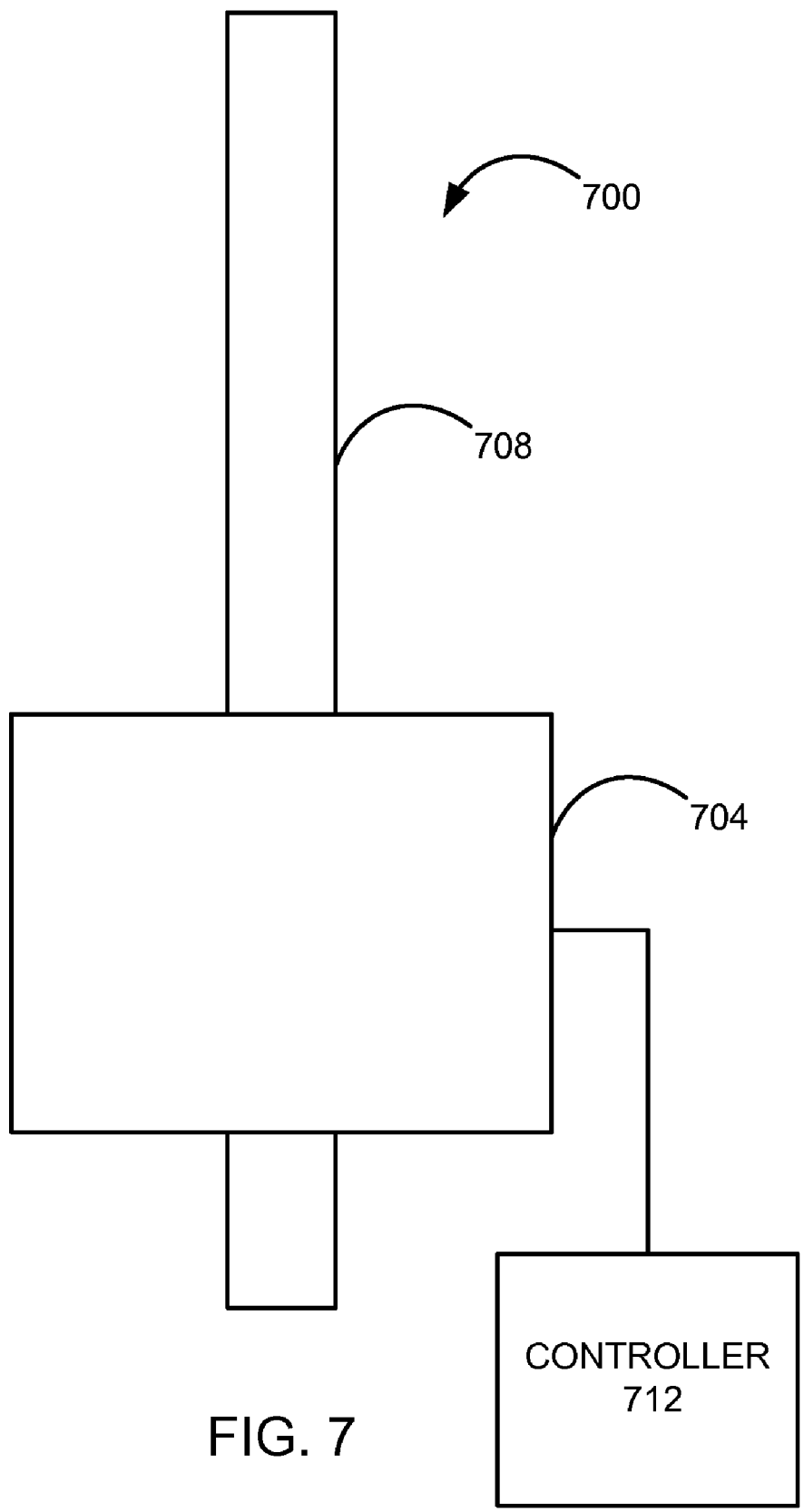
FIG. 7 is a schematic top view of a magnetic resonance imaging (MRI) system.

FIG. 7 is a schematic top view of a magnetic resonance imaging (MRI) system 700 that may be used in an embodiment of the invention. The MRI system 700 comprises a magnet system 704, a patient transport table 708 connected to the magnet system, and a controller 712 controllably connected to the magnet system. In one example, a patient would lie on the patient transport table 708 and the magnet system 704 would pass around the patient. The controller 712 would control magnetic fields and radio frequency (RF) signals provided by the magnet system 704 and would receive signals from detectors in the magnet system 704. In this example, the magnet system would comprise a plurality of coils for parallel imaging.

Figure 8A:
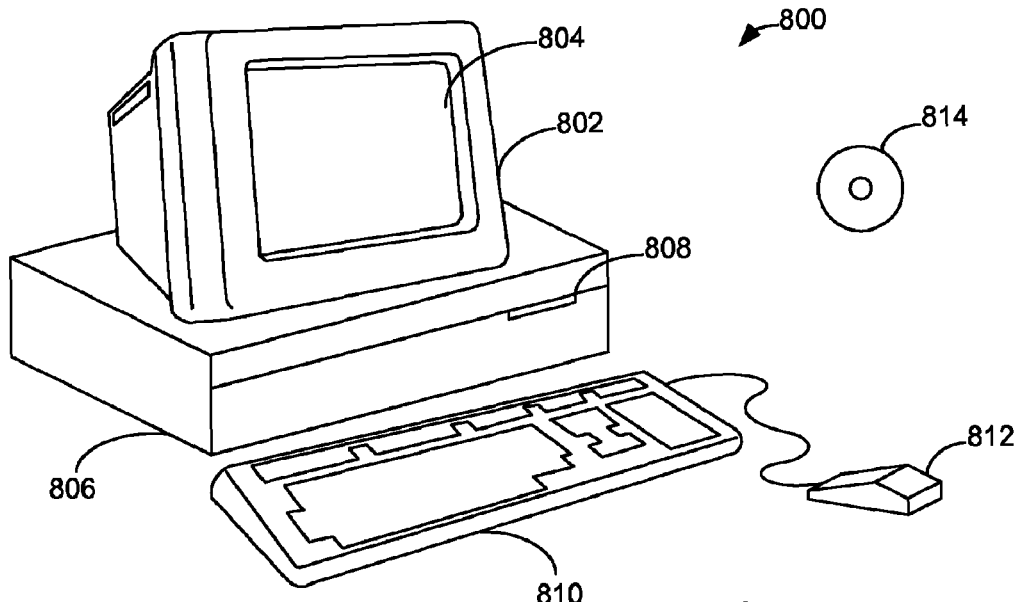
FIGS. 8a and 8b illustrate a computer system, which is suitable for implementing a controller used in embodiments of the present invention.
Figure 8B:
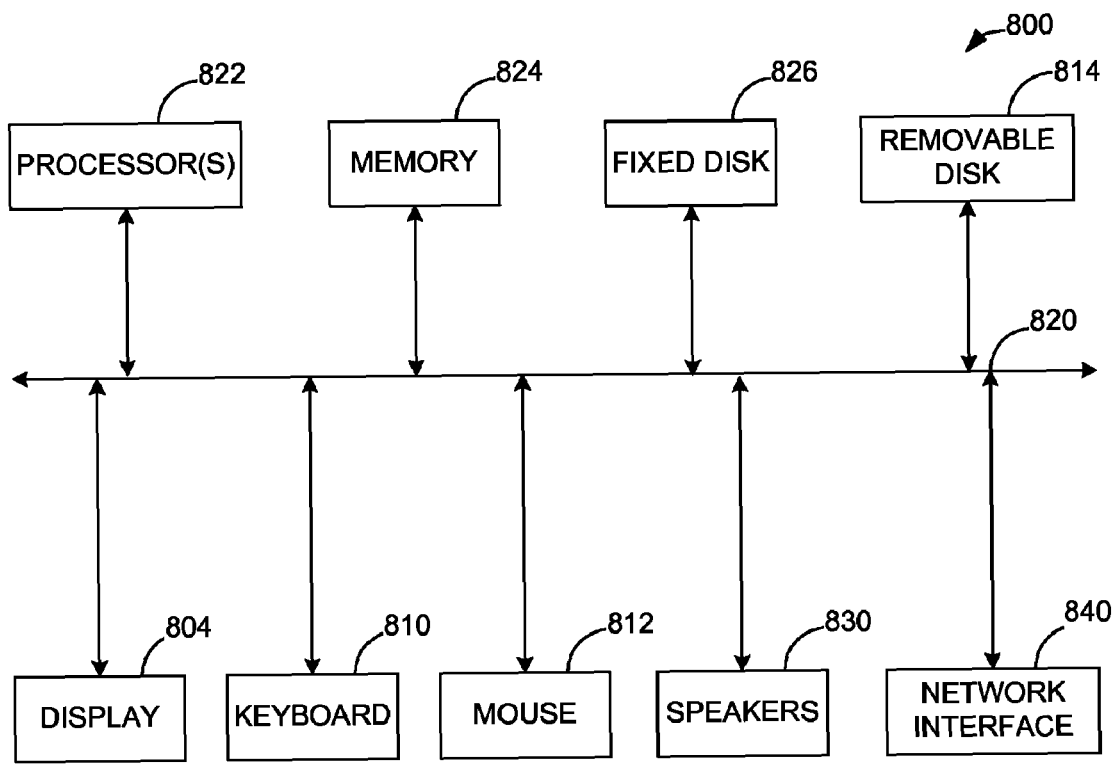
Figure 9A:
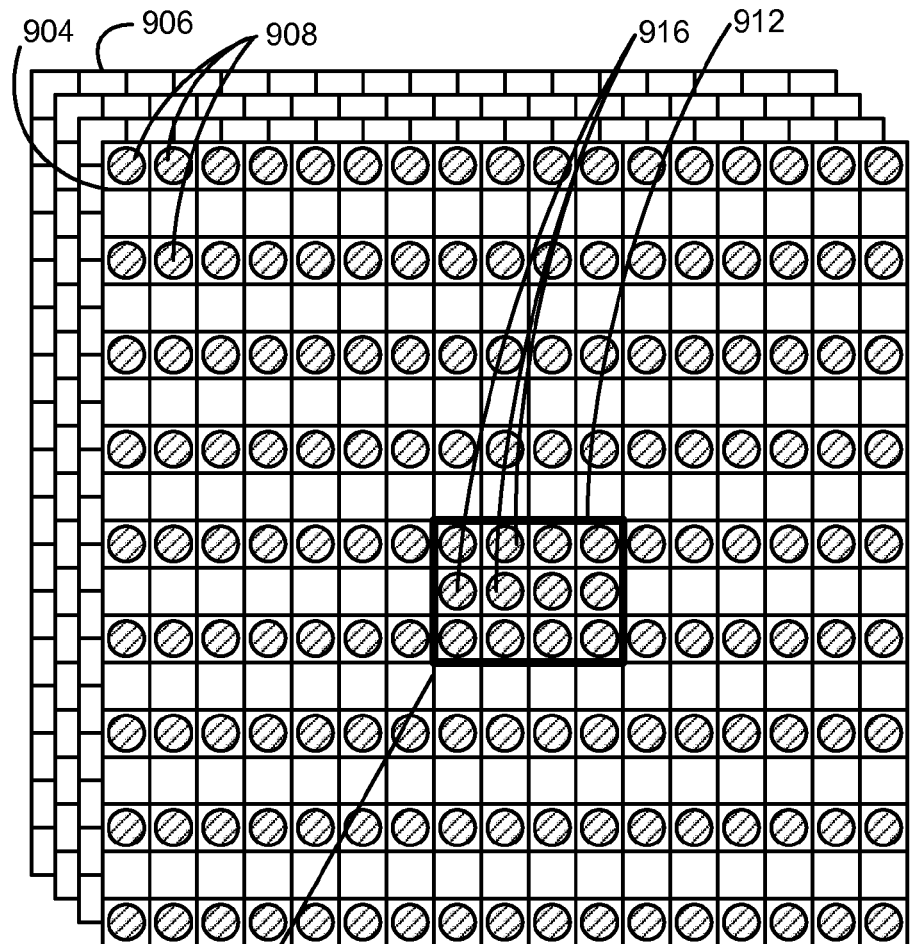
FIGS. 9a-c are schematic illustrations of a conventional GRAPPA process.
Figure 9B:
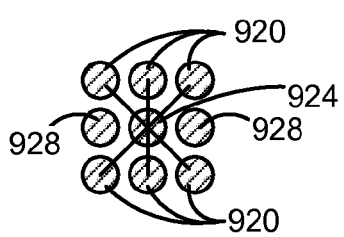
Figure 9C:
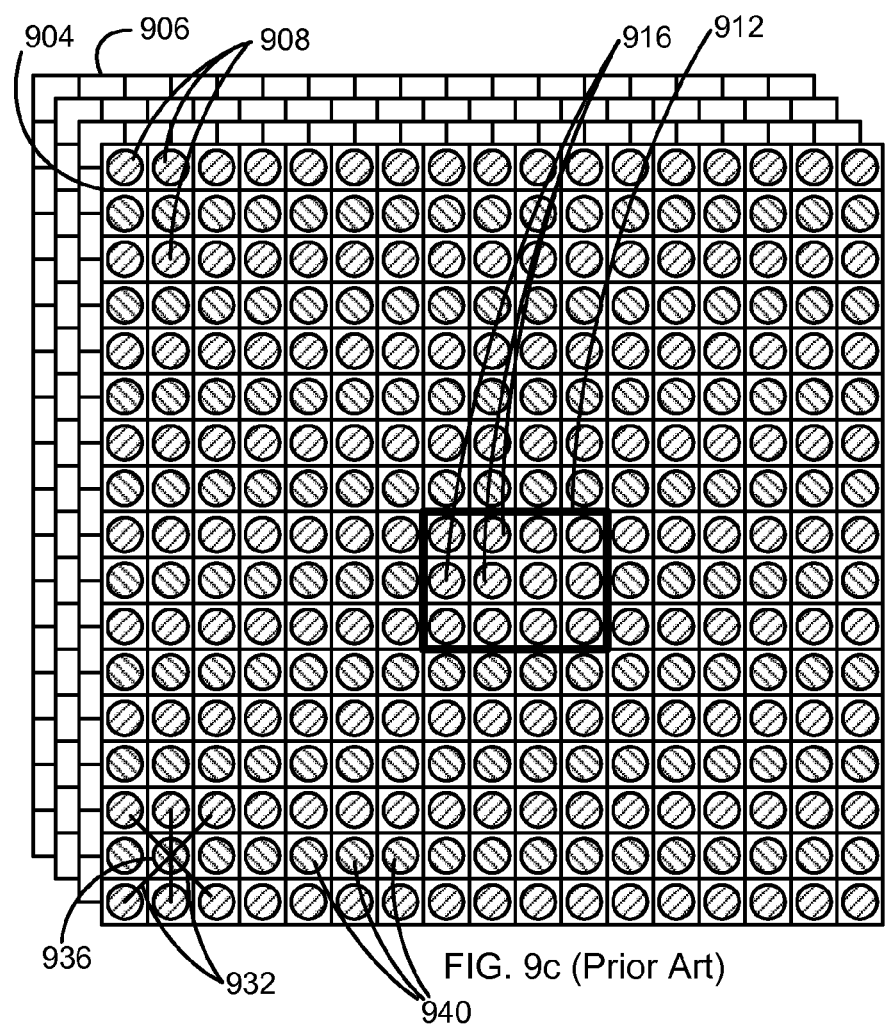

FIGS. 8a and 8b illustrate a computer system 800, which is suitable for implementing a controller 712 used in embodiments of the present invention. FIG. 8b shows one possible physical form of the computer system. Of course, the computer system may have many physical forms ranging from an integrated circuit, a printed circuit board, and a small handheld device up to a huge super computer. Computer system 800 includes a monitor 802, a display 804, a housing 806, a disk drive 808, a keyboard 810, and a mouse 812. Disk 814 is a computer-readable medium used to transfer data to and from computer system 800.

FIG. 8b is an example of a block diagram for computer system 800. Attached to system bus 820 are a wide variety of subsystems. Processor(s) 822 (also referred to as central processing units, or CPUs) are coupled to storage devices, including memory 824. Memory 824 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 826 is also coupled bi-directionally to CPU 822; it provides additional data storage capacity and may also include any of the computer-readable media described below. Fixed disk 826 may be used to store programs, data, and the like and is typically a secondary storage medium (such as a hard disk) that is slower than primary storage. It will be appreciated that the information retained within fixed disk 826 may, in appropriate cases, be incorporated in standard fashion as virtual memory in memory 824. Removable disk 814 may take the form of the computer-readable media described below.

CPU 822 is also coupled to a variety of input/output devices, such as display 804, keyboard 810, mouse 812, and speakers 830. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 822 optionally may be coupled to another computer or telecommunications network using network interface 840. With such a network interface, it is contemplated that the CPU might receive information from the network, or might output information to the network in the course of performing the above-described method steps. Furthermore, method embodiments of the present invention may execute solely upon CPU 822 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

An embodiment of the invention may apply the synthesizing filter to an image data set to create couple simultaneous equations for the image data set. Such a process would use a Fourier transform to transform the reduced k-space data set to a reduced image space data set.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention

What is claimed is:

1. A method for obtaining an image by parallel acquisition magnetic resonance imaging (MRI), comprising:
   a) exciting precessing nuclear spins in a region of a subject;
   b) simultaneously obtaining a plurality of response signals, representing magnetic resonance signals arising from the precessing nuclear spins, from the region respectively with a plurality of RF reception coils, with each response signal representing a reduced data set of a totality of all of said response signals, wherein the reduced data set is a reduced k-space data set, and wherein the complete data set is a complete k-space data set;
   c) additionally obtaining calibration data points for each data set;
   d) synthesizing a filter using the calibration data points, wherein the synthesizing filter, comprises:
      selecting a data point of the calibration data points; and
      using data points adjacent to the selected data point to calculate the synthesizing filter, wherein the using the data points adjacent to the selected data point uses all data points adjacent to the selected data point to calculate the synthesizing filter for the selected data point, wherein the synthesizing filter is sampling pattern independent and wherein the synthesizing filter provides calibration weights;
   e) applying the synthesizing filter to the reduced data set to obtain a plurality of coupled simultaneous linear equations with a plurality of unknowns, wherein the applying the synthesizing filter to the reduced k-space data set, comprises:
      selecting points; and
      applying the synthesizing filter, wherein for at least one of the selected points there is at least two of the combination of adjacent points used by the synthesizing filter and the selected point have unknown values; and
   f) solving the plurality of coupled simultaneously linear equations with the plurality of unknowns to obtain a complete data set, wherein the solving the plurality of simultaneous linear equations solves a constrained optimization, wherein the constrained optimization comprises minimizing $|Gx-x|^2$ and $|Dx-y|^2<\epsilon$, where $x=[x_1, x_2, \ldots, x_n]^T$ is a desired full-grid multi-coil reconstructed k-space images, $y=[y_1, y_2, \ldots, y_n]^T$ is the reduced k-space data set, G is the synthesizing filter, and D is a resampling operator and $\epsilon$ error less than noise.

2. The method of claim 1, wherein the constrained optimization comprises minimizing the Lagrangian form with regularization $|Gx-x|^2+\lambda R(F^{-1}x)$, $F^{-1}x$ denotes an inverse Fourier transform of the reconstructed k-space data and R is a regularization function, $\lambda$ is the Lagrangian multiplier.

3. The method of claim 1, wherein the simultaneously obtaining a plurality of response signals uses non-Cartesian sampling pattern, further comprising:
   gridding the non-Cartesian sampling pattern to Cartesian coordinates; and
   regridding a solution from Cartesian coordinates to non-Cartesian coordinates.

4. The method, as recited in claim 3, where at two coupled simultaneous equations share at least one unknown value.

5. The method, as recited in claim 1, wherein the minimizing the difference between acquisition data and reconstructed data performs a resampling of Cartesian coordinates estimated along an acquisition k-space trajectory.

6. The method of claim 1, wherein the synthesizing filter, comprises:
   selecting a data point of the calibration data points; and
   using data points adjacent to the selected data point to calculate the synthesizing filter, and
   wherein the applying the synthesizing filter to the reduced data set, comprises:
      selecting points; and
      applying the synthesizing filter, wherein for at least one of the selected points there is at least two of the combination of adjacent points used by the synthesizing filter and the selected point have unknown values.

7. The method of claim 1, further comprising forming an image from the complete data set and displaying the image.

8. The method of claim 1, wherein the synthesizing filter is sampling pattern independent.

9. The method of claim 1, wherein the synthesizing filter provides calibration weights.

10. The method of claim 1 wherein the solving the plurality of simultaneous linear equations solves a constraint optimization.

11. The method of claim 1, wherein the simultaneously obtaining a plurality of response signals uses non-Cartesian sampling pattern, further comprising:
    gridding the non-Cartesian sampling pattern to Cartesian coordinates; and
    regridding a solution from Cartesian coordinates to non-Cartesian coordinates.

12. The method, as recited in claim 1, where at two coupled simultaneous equations share at least one unknown value.

13. A magnetic resonance imaging apparatus, comprising:
    a magnetic resonance imaging excitation and detection system; and
    a controller electrically connected to the magnetic resonance imaging excitation and detection system, comprising:
       a display;
       at least one processor; and
       non-transitory computer readable media, comprising:
          computer readable code for exciting precessing nuclear spins in a region of a subject;
          computer readable code for simultaneously obtaining a plurality of response signals, representing magnetic resonance signals arising from the precessing nuclear spins, from the region respectively with a plurality of RF reception coils, with each response signal representing a reduced data set of a totality of all of said response signals, wherein the reduced data set is a reduced k-space data set, and wherein the complete data set is a complete k-space data set;
          computer readable code for additionally obtaining calibration data points for each data set;
          computer readable code for synthesizing a filter using the calibration data points;
          computer readable code for applying the synthesizing filter to the reduced data set to obtain a plurality of coupled simultaneous linear equations with a plurality of unknowns;
          computer readable code for solving the plurality of coupled simultaneously linear equations with the plurality of unknowns to obtain a complete data set, wherein the solving the plurality of simultaneous linear equations solves a constrained optimization, wherein the constrained optimization comprises minimizing $|Gx-x|^2$ and $|Dx-y|^2<\epsilon$, where $x=[x_1, x_2, \ldots, x_n]^T$ is a desired full-grid multi-coil reconstructed k-space images, $y=[y_1, y_2, \ldots, y_n]^T$ is the reduced k-space data set, G is the synthesizing filter, and D is a resampling operator and E error less than noise;
          computer readable code for forming an image from the complete data set; and
          computer readable code for displaying the image on the display.

* * * * *